United States Patent [19]

Kowalski

[11] Patent Number: 5,552,621
[45] Date of Patent: Sep. 3, 1996

[54] MEMORY WITH EEPROM CELL HAVING CAPACITIVE EFFECT AND METHOD FOR THE READING OF SUCH A CELL

[75] Inventor: Jacek Kowalski, Trets, France

[73] Assignee: Gemplus Card International, Gemenos, France

[21] Appl. No.: 331,871

[22] Filed: Nov. 1, 1994

Related U.S. Application Data

[63] Continuation of Ser. No. 888,639, May 27, 1992, abandoned.

[30] Foreign Application Priority Data

May 29, 1991 [FR] France ................. 91 06466

[51] Int. Cl.⁶ ................................................. H01L 29/788
[52] U.S. Cl. .................... 257/321; 257/300; 257/322; 365/185.26; 365/185.01; 365/185.28; 365/185.05
[58] Field of Search ................................. 257/321, 322, 257/300; 365/185, 185.26, 185.01, 185.28, 185.05

[56] References Cited

U.S. PATENT DOCUMENTS

| | | |
|---|---|---|
| 4,037,243 | 7/1977 | Hoffmann et al. . |
| 4,242,736 | 12/1980 | Raffel et al. . |
| 4,363,109 | 12/1982 | Gardner, Jr. .............................. 257/300 |
| 4,663,645 | 5/1987 | Komori et al. . |
| 4,827,450 | 5/1989 | Kowalski . |
| 4,868,489 | 9/1989 | Kowalksi . |
| 4,881,199 | 11/1989 | Kowalski . |
| 4,890,187 | 12/1989 | Tailliet . |
| 4,896,298 | 1/1990 | Kowalski . |
| 4,916,333 | 4/1990 | Kowalski . |
| 4,989,053 | 1/1991 | Shelton ................................... 257/300 |
| 5,003,371 | 3/1991 | Tailliet . |
| 5,017,979 | 5/1991 | Fujii et al. ............................... 257/321 |
| 5,017,980 | 5/1991 | Gill et al. ................................ 357/321 |
| 5,022,001 | 6/1991 | Kowalski . |
| 5,060,198 | 10/1991 | Kowalski . |
| 5,060,261 | 10/1991 | Avenier . |
| 5,097,146 | 3/1992 | Kowalski . |
| 5,243,210 | 9/1993 | Naruke ................................... 257/321 |
| 5,291,439 | 3/1994 | Kauffmann et al. .................... 257/321 |

FOREIGN PATENT DOCUMENTS

92/06451  10/1991  WIPO .

Primary Examiner—Sara W. Crane
Assistant Examiner—John Guay
Attorney, Agent, or Firm—Pollock, Vande Sande & Priddy

[57] ABSTRACT

In a memory cell of an EEPROM or flash-EEPROM memory, the source and the drain of a floating-gate transistor forming the non-volatile memorizing device are connected together. It is shown that the capacitive behavior of the cell is then differentiated at the time of the reading depending on whether it is in a programmed state or in an erased state. This difference in behavior is used to differentiate the logic states.

6 Claims, 4 Drawing Sheets

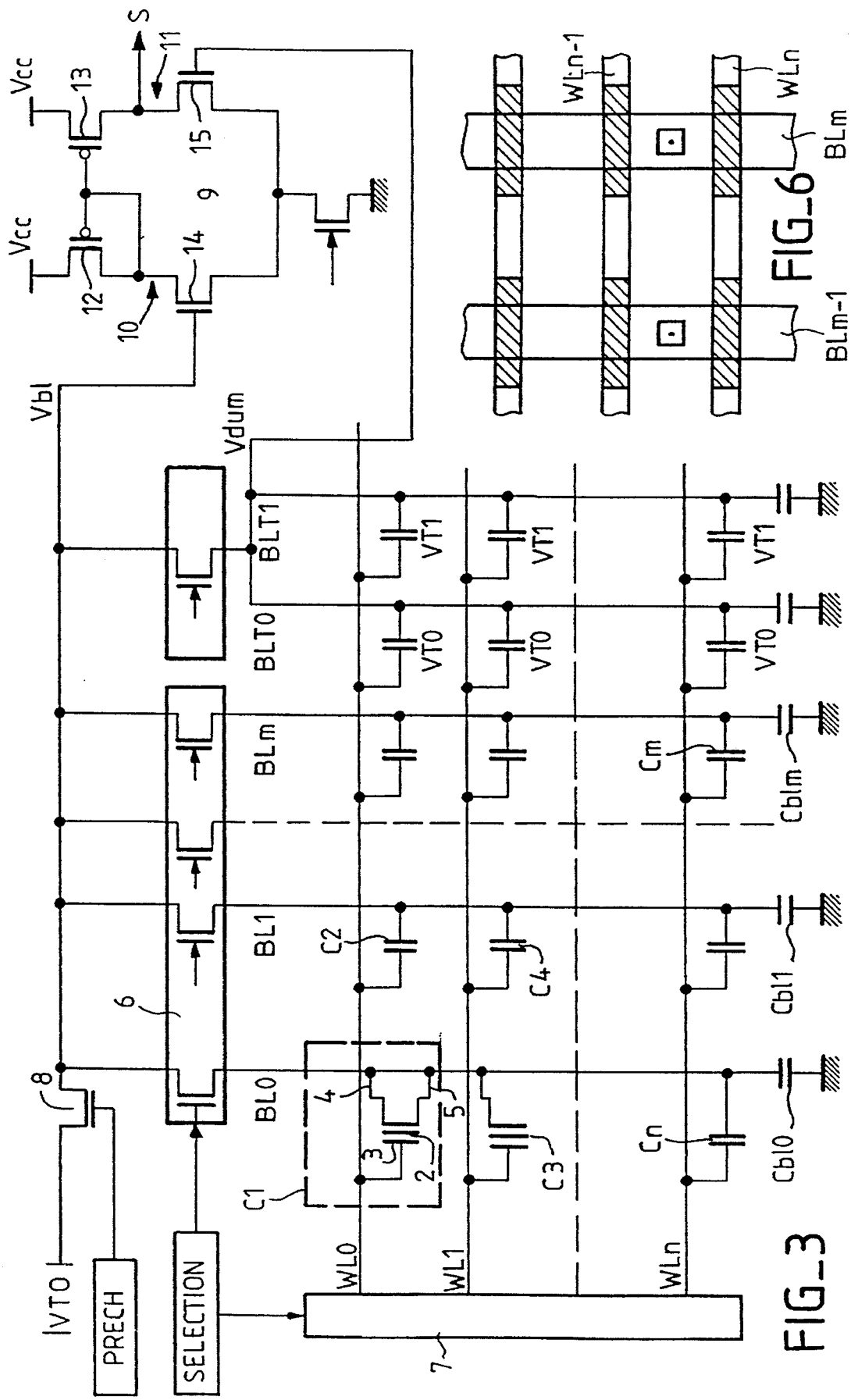

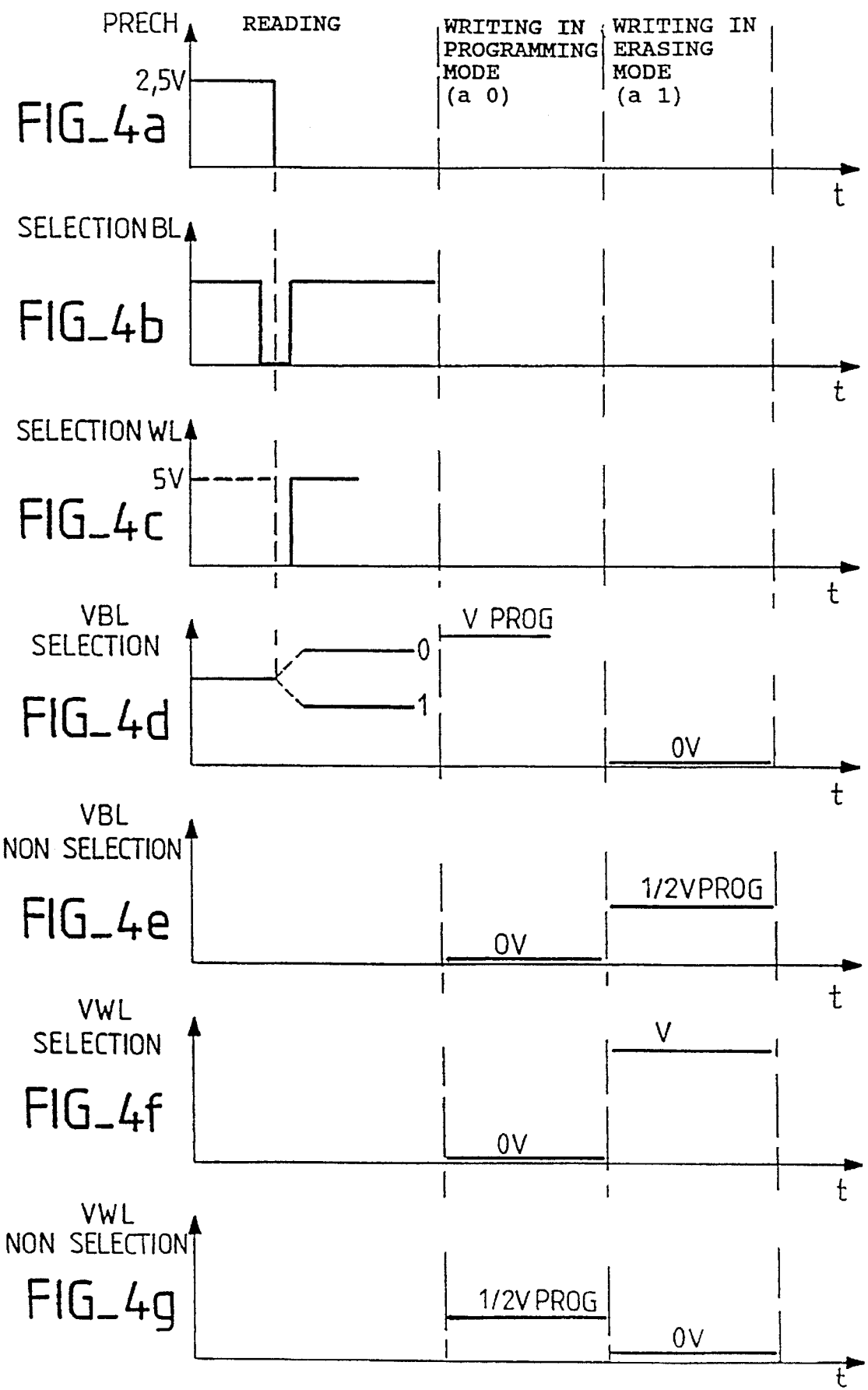

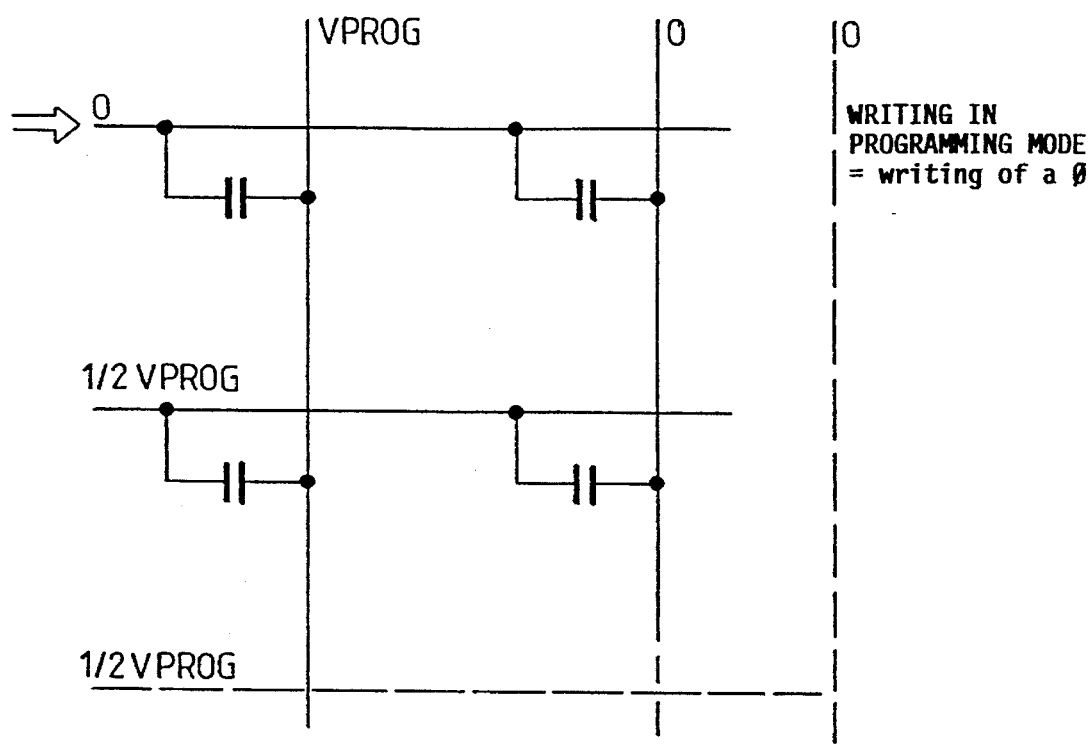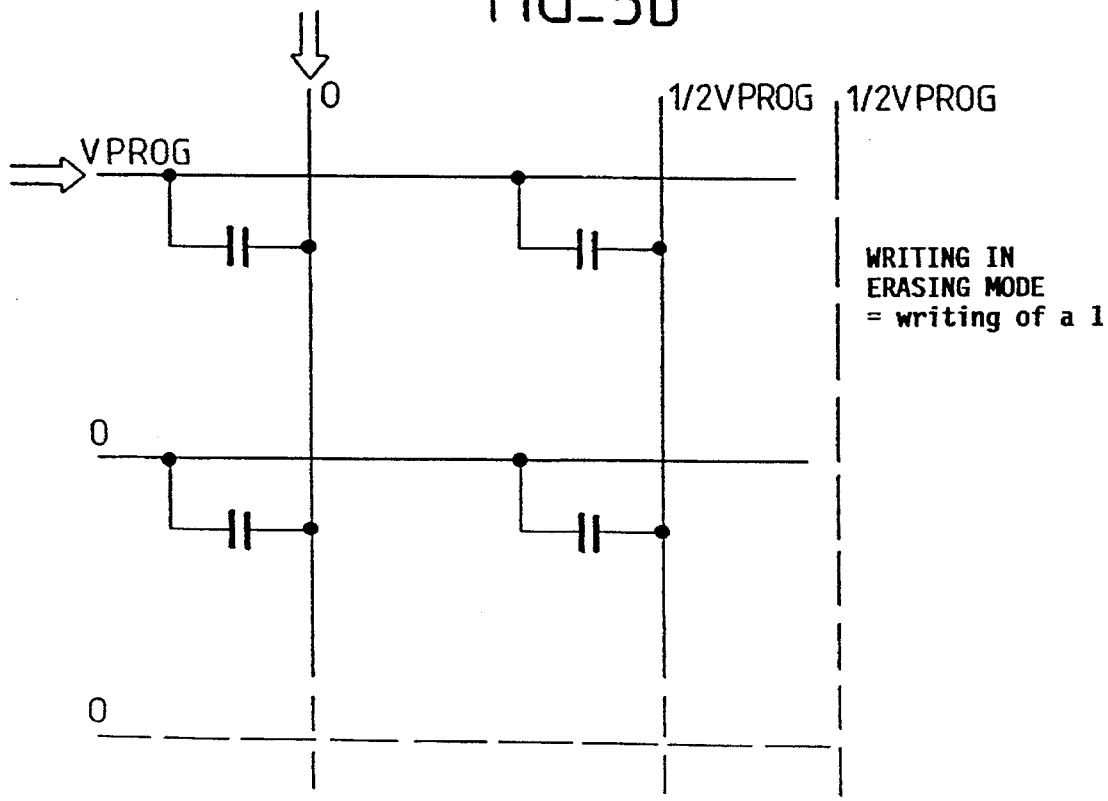

MEMORY WITH EEPROM CELL HAVING CAPACITIVE EFFECT AND METHOD FOR THE READING OF SUCH A CELL

This application is a continuation of U.S. patent application Ser. No. 07/888,639, filed May 27, 1992 now abandoned.

BACKGROUND OF THE INVENTION

1. Field of the Invention

An object of the present invention is an EEPROM (electrically erasable and programmable read-only memory) provided with a memory cell with capacitive memorizing. It also relates to a method for the reading of a memory cell such as this. It can be applied to the field of non-volatile memories. This field corresponds to that of memory cells, each provided with a floating-gate transistor as a memorizing element. The aim of the invention is to increase the density of integration of these cells on one and the same semiconductor substrate. The cells of the invention enable the storage, in a lasting way, of one binary logic state (1 or 0) or another, even if the supply of the electronic circuit to which they are connected is cut off. The following are the advantages of the cells of the invention:

- very small geometrical size of the cell, whence the possibility of making very dense memories;
- zero consumption of current in reading and programming modes, which is very useful for contactless chip cards or in space-related applications;
- the use of standard existing manufacturing technologies, namely those of cells known as EEPROM or flash-EEPROM cells;
- the possibility of writing a 0 or a 1 in only one cell at a time instead of having to process an entire block:
- greater reading speed through reading at zero current.

2. Description of the Prior Art

There are known non-volatile memory cells with a floating-gate transistor. Electrical charges are stored in this floating gate. The transistor is on or off depending on the memorized state, depending on the number of charges stored. These cells are of three types. There are the EPROM cells, the EEPROM cells and the flash-EEPROM cells. With an EPROM cell, the floating gate may be charged with electrons or it may have its electrons discharged. The floating-gate transistor is on when the floating gate has its electrons discharged. The integration density of these cells is good, but the programming current (to inject the electrons into the floating gate) is substantial. The programming voltage should therefore be given from the exterior of the integrated circuit which comprises the memory. These cells are not electrically erasable: they should be erased by an ultraviolet radiation. This furthermore prompts the erasure of the entire memory and not that of only one cell at a time. For the reading of a cell such as this, as for the reading of the cells of the other two types, a measurement is made of the intensity of a so-called reading current flowing through this transistor.

With an EEPROM memory, the access to a cell should be set up through an access transistor: the integration density is thereby reduced by four. The gate oxide interposed between the floating gate and the conduction channel of the transistor is far smaller than for an EPROM cell. It is of the order of 7 nm. The floating-gate transistor is on when the floating gate is charged with holes. It goes off when the floating gate is charged with electrons. The cells are programmable and erasable by blocks.

The flash-EEPROM cells have a same type of technological architecture as the EEPROM cells, but without any access transistor. Their integration density is greater. However, it is difficult to devise the manufacturing method: during the programming, the programming time is very lengthy (some seconds) and the programming threshold voltages have to be very precisely controlled. The cell consumes current in erasure mode and in reading mode.

The gates of all these cells are preferably one on top of the another, but it is quite possible to envisage the making of a buried control gate surmounted by the floating gate. The latter then overhangs the edge of a drain region of a transistor, or quite simply a doped region. This will also be the case for the cells of the invention even though, to simplify matters, the present invention relates more specifically to stacked structures.

A cell, in the prior art or in the invention, is said to be programmed if it has received holes on its floating gate. It is said to be erased if it has received electrons. When it is programmed, its conduction threshold is negative: for example, the value of this threshold is −2 V. Thus, this cell would become conductive if the voltage applied to its control gate of its transistor were to be greater than −2 V, while it is biased by 5 V at its drain and 0 V at its source. When it is erased, its conduction threshold is positive, for example 4 V, under the same conditions as above. The conduction threshold is therefore greater in the erased state than in the programmed state.

SUMMARY OF THE INVENTION

An object of the invention is to overcome the drawbacks mentioned by implementing a physical principle that is different from the principle of conduction of floating-gate transistors. In the invention, the variation of the capacitance of a transistor, or rather of a floating-gate MOS type device, is monitored as a function of the voltage applied to its control gate. Indeed, it is observed that there is a capacitance between the floating gate and the drain of the transistor, just as there is a capacitance between this floating gate and the semiconductor substrate, at the position of the conduction channel. On the one hand, the latter capacitance varies greatly depending on whether the transistor is on or off. Either this capacitance exists between the floating gate and the substrate if the voltage of the control gate is lower than the conduction threshold of the transistor (and then it is low), or it exists between the floating gate and the conduction channel created by the transistor if the voltage of the floating gate exceeds the conduction threshold voltage of the transistor (and then it is high). Secondly, when the transistor is on, this floating gate/conduction channel capacitance gets added to the floating gate/drain capacitance since it is connected to it in parallel by the conduction channel.

In the invention, the proposed cell has its drain and its source short-circuited or else not even one of them exists. There is therefore no longer any transistor properly speaking. The existence or non-existence of a conduction channel can be explained, however, as follows. It exists when the voltage at the control gate is greater than the threshold voltage. When this channel exists, the floating gate/channel capacitance exists. On the contrary, between the floating gates (made of first level polysilicon) and the control gates (made of second level polysilicon in the stacked structures) or between them and the conduction zone of the transistor, or the semiconductor substrate, there is no current.

If the channel does not exist, the capacitance between the floating gate and the substrate continues to exist. However, this is low for a control gate voltage that is in the region of or lower than the threshold voltage. The capacitance that is used in the device of the invention is the capacitance between the floating gate and a bit line that is schematically constituted by a drain. When the voltage of the control gate exceeds the threshold voltage, the channel is created. There is then an electrical connection between the channel and a drain diffusion or source diffusion acting as a bit line. If this voltage is below this value, even if the channel exists there is actually no electrical connection between the channel and the drain or source diffusion. This is due to the presence of the deserted zone created around the diffusion ($n^+$) of this drain or of this source. This behavior is used during the reading.

An object of the invention is a memory cell of an integrated circuit in a semiconductor substrate, comprising a control gate that controls a floating gate and is insulated from it, this floating gate being insulated from the semiconductor substrate, this insulation comprising at least one window made of a tunnel oxide, wherein, at the position of this tunnel oxide window, this gate partially surmounts a single region of this substrate doped with impurities of a type opposite to that of the impurities doping the substrate around this single region. The tunnel window may furthermore occupy the entire surface of the insulation between the floating gate and the substrate. In the cell of the invention, there are only two accesses: one on the control gate and one on the region. There is then no region that can constitute a source and that would be connected furthermore to the ground or to another potential.

An object of the invention is also a memory cell of an integrated circuit in a semiconductor substrate, comprising a control gate that controls a floating gate and is insulated from it, this floating gate being insulated from the semiconductor substrate, this insulation comprising at least one window made of a tunnel oxide above the conduction channel of a transistor made in the semiconductor substrate, wherein the drain and source regions of this transistor are electrically connected. In this sense, it will be understood that, according to the meaning given in the invention, a transistor is formed by any pair of regions diffused in the substrate, short-circuited together and surmounted by a floating gate.

Finally, an object of the invention is a method for the reading of a memory cell in a memory provided with cells with a floating-gate device, this device comprising a control gate connected to a word line and to a source region, or drain region, connected to a bit line, this cell being in a programmed or erased state, the conduction threshold of a conduction channel of the floating-gate device being lower in the programmed state than in the erased state, wherein the bit lines are precharged at a voltage, the value of which is at least equal to the absolute value of the conduction threshold of the cell for a programmed state to minimize the capacitances of the bit lines;

the bit line and the word line concerned by the cell to be read are selected, and the voltage remaining on the selected bit line is compared with a reference voltage, and the state read is deduced therefrom.

BRIEF DESCRIPTION OF THE DRAWINGS

The invention will be understood more clearly from the following description and from the appended figures. These figures are given purely by way of an illustration and in no way restrict the scope of the invention. Of these figures:

FIG. 3 shows a memory according to the invention and the specific features of its reading system;

FIGS. 4a to 4g are timing diagrams showing, for three uses of the memory, the voltages applied in its control circuit;

FIGS. 5a and 5b show a simplified view of the voltages applicable to the bit lines and word line of the memory to program or erase a memory cell respectively;

FIG. 6 shows a diagram of the implantation of memory cells of the memory in a semiconductor substrate.

MORE DETAILED DESCRIPTION

Figure 1A:
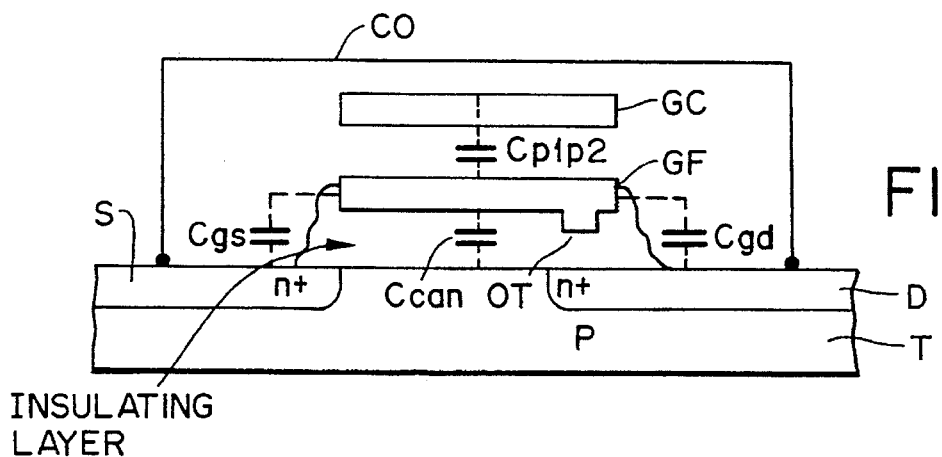
FIGS. 1a to 1c show a schematic view of the architecture of the capacitances in a transistor or, more generally, in a floating-gate device.
Figure 1B:
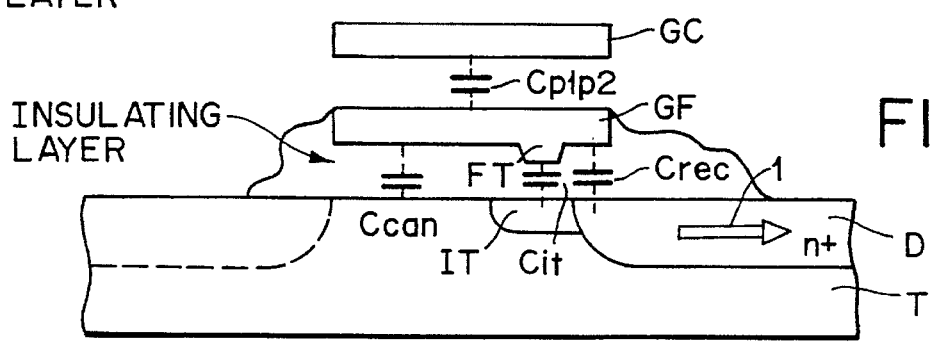
Figure 1C:
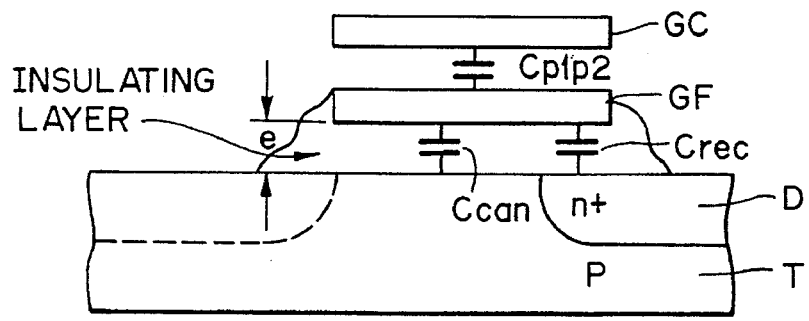

FIGS. 1a to 1c show cells, according to the invention, of various types: respectively theoretical, derived from an EEPROM cell and derived from a flash-EEPROM cell. In these figures, a semiconductor substrate T contains a cell according to the invention. This semiconductor substrate T is provided with a control gate GC, made of a second level polysilicon layer. The gate GC is separated by an oxide layer from a floating gate GF, made of a first level polysilicon layer. The gate GF is separated from the substrate T, at least at one position, by a layer tunnel oxide OT having a small thickness. In the case of the cell derived from an EEPROM cell, beneath the oxide OT, in the substrate, there is a tunnel implantation IT furthering the injection of electron charges into the gate GF. In the case of the cell derived from the flash-EEPROM cell, all the oxide beneath the gate GF is an oxide tunnel with a small thickness e.

In the case of FIG. 1a, the gate GF is superimposed on the conduction channel of a transistor comprising a source S and a drain D connected to each other by a connection CO. In the case of FIGS. 1b and 1c, the sources are not made. If they are, they are also connected to the drains D. The drains or sources are made in the form of $n^+$diffusions in the p type substrate T. In practice the best cell, namely the one that takes the least space, is the one in which the source regions are not made because they are in fact unnecessary.

The existing capacitances between these different elements of the floating-gate device are the following:

Cp1p2 capacitance between the gate GC and the gate GF;

Cgd capacitance between the gate GF and the drain D (or rather the diffusion identified with this drain).

Cgs capacitance between the gate GF and the source S of the transistor. Inasmuch as S is connected to D by a connection CO, or inasmuch as S does not even exist, Cgs will be identified with Cgd.

Ccan capacitance existing between the gate GF and the substrate T when the voltage at the gate GC is higher than the threshold voltage of conduction of the transistor.

Cgt capacitance between gate GF and substrate T when the transistor is not on. This capacitance is negligible.

The capacitance Cgd itself can be divided into an overlapping capacitance Crec between the part of the drain that goes under the gate GF and the gate GF itself and a tunnel implantation capacitance Cit. The latter capacitance is visible here only in the variant derived from EEPROM technology where a tunnel implantation is made under the tunnel oxide part.

Figure 2A:
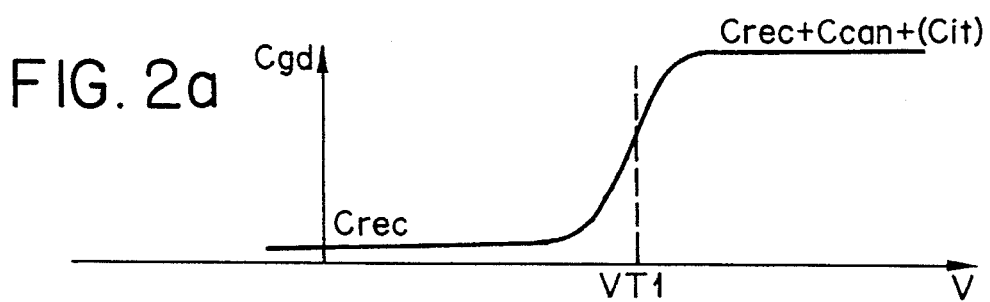
FIGS. 2a and 2b are graphs showing the development of the floating gate/drain capacitance of the floating-gate device as a function of the voltage applied to the floating gate, in the case of an erased cell or programmed cell respectively.
Figure 2B:
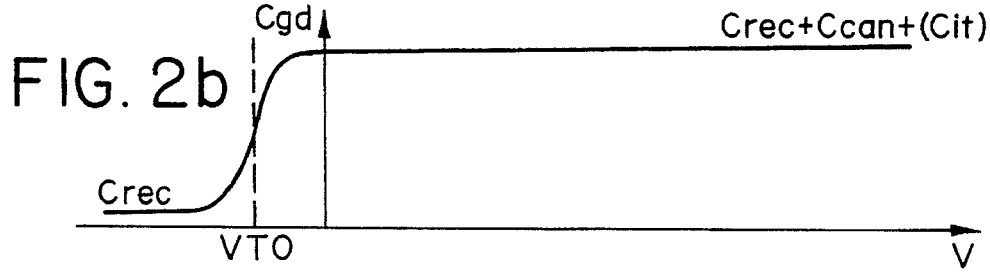

These capacitances are placed in a circuit as follows. The capacitance Cp1p2 is in series with the capacitances Cgd and Ccan. When the channel is connected, the latter two capacitances get added to each other and together play the role of the capacitance Cgd. When it is not connected, only the intrinsic capacitance Cgd comes into play in the equivalent connection diagram. The latter, when it acts alone, is equivalent to Crec. The development of the floating gate/drain capacitance as a function of the voltage applied to the control gate GC is shown in FIGS. 2a and 2b. In the erased state (a 1 is written in the cell) the threshold voltage for the creation of the connection of the channel is VT1. In one example, VT1 is equal to 4 volts. In the programmed state (a 0 is written in the cell) the threshold for the creation of the connection of the channel is VT0. In one example, VT0 equals–2 volts. As soon as the voltage at the gate GC becomes greater than the threshold voltage, the capacitance Cgd goes from the value Crec to the value Crec+Ccan+ (possibly) Cit.

The cell works as follows. Through the existence of a tunnel window (with a thickness of about 10 nm), charges may be conducted to the gate GF if a sufficiently big electrical field (of the order of 10 MV/cm) is applied through the tunnel oxide. This field is obtained by taking the gate GC to about 20 V when the drain is at 0 V or vice versa. Depending on the direction of the field applied, either electrons or holes are stored. The addition of these charges to the floating gate enables the modifying of the threshold voltage of the MOS transistor, seen from the gate GC. This programming is similar in its principle to that of the EEPROM or flash-EEPROM cells of the prior art.

For an erased cell, the capacitance of the cell seen from the gate GC is:

Ca0=Cp1p2.Crec/(Cp1p2+Crec)

For a programmed cell, the capacitance of the cell seen from the gate GC is:

Ca1=Cp1p2.(Ccan+Crec)/(Cp1p2+Ccan+Crec)

The drawback of a capacitive cell derived from an EEPROM cell arises out of the fact that the capacitance Crec is relatively high (there is then a smaller difference between Ca0 and Ca1), which damages reading sensitivity. To reduce this capacitance Crec, the tunnel window FT is pushed back towards the edge of the gate GF, in the direction of the arrow 1 for example.

In the technology derived from the flash-EEPROM technology, where the entire gate oxide GF is a tunnel oxide, to improve the programming or the erasure it is possible to add an LDD type implantation on the drain to extend it slightly beneath the gate GF. This has the advantage of reducing the capacitance Crec to the minimum and of thus having a cell that is as small as possible.

FIG. 3 shows a memory according to the invention with a memory cell C1 comprising a floating-gate transistor 1. The floating gate 2 of this transistor is interposed between a control gate 3 and a drain 4 and a source 5 connected to each other. The gate 3 is connected to a word line WL0, and the drain 4 and source 5 are connected together to a bit line BL0. The other cells C2 to Cn and Cm are represented schematically by their equivalent capacitance Ca connected between one of the bit lines BL0 to BLm and one of the word lines WL0 to Wln. The cell C3 adapts a symbolism which clearly shows that there is only one useful diffusion in the device of the invention. The bit lines and word lines are arranged as a matrix. They are also connected to decoders 6 and 7 respectively for the decoding of bit lines and the decoding of word lines. These decoders receive address signals enabling the selection of each cell in turn, or possibly of several cells at the same time. This approach is symbolized here by the control of transistors, which are series connected with the bit lines and come on when they receive a signal decoded by the decoder. The selected bit line is then connected with the reading system. The memory also comprises a precharging circuit supplied by a precharging voltage greater than |VT0| and controlled by a precharging signal PRECH. The signal PRECH is applied to the control gate of a transistor 8, interposed between a connection Vb1 connected to a line bit input of the decoder and to the precharging supply. The voltage should be greater than |VT0| because, from one cell to another, the threshold voltage may vary and because it is preferable to take precautions.

In one example, the memory further includes two additional bit lines BLT0 and BLT1. These two bit lines are connected to each other and to a connection Vdum. One of the bit lines BLT0 serves only the programmed cells, while the other bit line BLT1 serves only the erased cells.

A reading circuit 9 comprises a differential amplifier receiving the signals given out on the connections Vbl and Vdum. This known type of differential amplifier has two branches 10 and 11 between the general supply Vcc of the circuit and the electrical ground. Each branch has a P type transistor, 12 and 13 respectively, in series with an N type transistor, 14 and 15 respectively. The control gates of the transistors 12 and 13 are connected to each other and between the transistor 12 and the transistor 14. The transistor 14 has its control gate connected to the connection Vbl. The transistor 15 has its control gate connected to the connection Vdum. The reading output S of the memory is the midpoint between the transistors 13 and 15. The two branches 10 and 11 are connected together to the ground by a connection transistor setting up this connection at appropriate moments to avoid any unnecessary flow in the reading circuit 9 outside these moments.

FIGS. 4a to 4g show timing diagrams respectively of the bit line precharging, selection or addressing signals and of signals available on the bit line of the selected cell, on the bit lines of the non-selected cells, on the word line of the selected cell and on those of the non-selected cells.

For the reading, for the duration of a precharging command, for example all the bit lines are precharged. They are precharged at least at |VT0| which represents the threshold voltage of a programmed cell. In the example where VT0 equals–2 volts, the bit lines are therefore precharged at more than 2 volts, for example at 2.5 volts. This enables capacitance of each bit line to be minimized. Indeed, the capacitance Ccan of a programmed cell is no longer added to the capacitance Crec of this cell if the drain voltage of this cell is greater than |VT0|. With this condition, the precharging capacitance of a bit line is equal to Cbl (stray capacitance of the bit line connection itself) plus n times Crec if there are n cells on the same bit line.

During the reading, after the precharging, only the bit line connected to the cell to be selected is connected to the amplifier 9. Similarly, during the reading, only the line corresponding to the cell to be selected is carried to V volts, for example 5 volts, or even more if a voltage multiplying technique is used. The other word lines remain at 0 volts. For example, WL0 is taken to 5 volts. The selection of the word line is subsequent to the end of the precharging.

Let us assume that the cell C1 is in a programmed state and that it is read. At the time of the reading, it causes the passage, on the bit line BL1, of a voltage variation equal to:

$\delta V = V \cdot Ca/(Ca+Cbltot)$ where V is equal, in the example, to 5 volts, where Ca is the equivalent capacitance of the cell and Cbltot is the capacitance of the totality of the bit line. The following can also be written:

$$\delta V = (Vbl-|VT0|) \cdot Cgd/(Cgd+Cbltot)+(V-Vbl+|VT0|) \cdot (Cgd+Ccan+Cbltot)$$

The first term is due to the capacitance Cgd before the word line goes beyond the threshold voltage for the creation of the channel. The second term is due to the voltage passed on the bit line after the channel connection has been created.

If the cell C1 is in an erased state during the reading, the voltage that passes on the bit line is only $\delta V = V \cdot Cgd/(Cgd+Cbltot)$ for, since V (equal to 5 volts) is smaller than $|VT1|+Vbl$ (equal to 4 volts+2.5 volts), the capacitance Ccan is not used in the coupling: there is no channel connected to the n$^+$diffusion.

To carry out the detection of the state of the cell read, the final voltage on the bit line is compared with a reference voltage. The reference voltage is a mean voltage, delivered by the bit lines BLT0 and BLT1 connected to each other, between the voltage delivered by an erased cell and a programmed cell read together.

For the detection of a programmed state (a 0), in the ideal case where Crec is far smaller than Ccan and where Ccan is of the order of one-twentieth of Cbltot, we obtain:

$$\delta V0 = 0.023(V-Vbl+|VT0|)$$

For the detection of an erased state (a 1), in the ideal case where Crec is far smaller than Ccan and where Ccan is of the order of one-twentieth of Cbltot, we obtain:

$$\delta V1 = 0.024(V-Vbl+|VT0|)$$

It is seen that the values of $\delta V$ are roughly symmetrical with respect to the mean voltage of comparison. For example, with the values given up till now, they are equal to $\delta V0=104$ mV and $\delta V1=-109$ mV. The differential amplifier 9 is capable of detecting these differences.

FIGS. 5a and 5b show the voltages to be applied to the bit lines and word lines participating in a cell selected to be programmed or erased (indicated by arrows) as well as those that have to be applied during these operations to the other lines participating in the non-selected cells. During the programming, the programming voltage VPROG is applied by the bit line to the drain and 0 volts are applied by the word line to the gate of the selected cell. So as not to affect the state of the other cells, half of the programming voltage is applied to all the non-selected word lines and 0 volts to the bit lines where the cell does not have to change its state. For the erasure, the direction of the electrical field is reversed. To this end, VPROG is applied to the gate by means of the word line, and 0 volts to the drain by means of the bit line of the selected cell. So as not the affect the content of the other cells, the bit lines whose cells do not have to change their state to ½ VPROG and all the other word lines are taken to 0 volts.

A great advantage of this structure is that only one cell can be erased or programmed at a time. However, it is also possible to program or erase entire lines. For example, to erase all the cells of a line, it is taken to VPROG while all the bit lines are kept at 0. For the non-selected lines or columns, the voltage ½ VPROG is used. It makes it possible to have an electrical field on the non-selected cells, that is twice as weak, namely enough to trigger a tunnel effect needed for the programming or erasure.

FIG. 6 shows the word lines WLn, WLn−1 made in the form of a second level polysilicon strip and capable themselves of playing the role of a control gate when they are placed above (with an insulation) etched plates, marked with hatchings, made of first level polysilicon and playing the role of floating gates. A "drain" region has been diffused in the substrate between the line WLn and the line WLn−1, parallel to these word lines and slightly beneath it if there should be overlapping. Between these two word lines, in the alignment of the plates, electrical connections are made between its drain diffusions and the metallized bit lines BLm, BLm−1 which surmount the word lines and are perpendicular to these word lines. The drain diffusions and the connections with the bit lines may take position between each word line, cell C1, or once every other time, cell C3.

What is claimed is:

1. A memory cell for an integrated circuit memory, the cell having components mounted on a semiconductor substrate and further comprising:

a control gate;

a floating gate, controlled by the control gate and insulated from the control gate;

an insulation layer for insulating the floating gate from the substrate and including at least one tunnel window made of a tunnel oxide;

a transistor having a channel region, as well as drain and source regions diffused in the substrate and located adjacent the channel region;

and a conductor overlying and forming a permanent connection between the drain and source regions, the conductor extending in spaced overlying relation to the substrate and the floating gate.

2. A memory cell as set forth in claim 1 wherein a tunnel window is located intermediate oppositely confronting surfaces of the floating gate and that portion of the drain region located immediately adjacent the channel region.

3. A memory cell for an integrated circuit memory, the cell having components mounted on a semiconductor substrate and further comprising:

a control gate;

a floating gate, controlled by the control gate and insulated from the control gate;

an insulation layer for insulating the floating gate from the substrate and including at least one window made of a tunnel oxide;

a first region formed in the substrate, said first region being diffused with a dopant of the type opposite that of a dopant in a channel region;

the channel region formed in the substrate and juxtaposed adjacent said diffused first region, the channel region being doped with a dopant of the type opposite that of the first region;

a second region adjacent to the channel region, opposite to the first region with regard to the channel region, said second region being diffused with a dopant of a type opposite that of the dopant in the channel region;

a conductor overlying and forming a permanent connection between the first region and second region, the conductor extending in spaced overlying relation to the substrate and the floating gate;

the floating gate positioned in overlying spaced relation to the first region and the channel region;

the tunnel window of the insulation layer being aligned between the floating gate and the first region.

4. A memory cell for an integrated circuit memory, the cell having components mounted on a semiconductor substrate and further comprising:

a control gate;

a floating gate, controlled by the control gate and insulated from the control gate;

a tunnel oxide insulation layer for insulating the floating gate from the substrate;

a first region diffused in the substrate;

a channel region formed in the substrate and located adjacent said first region;

a second diffused region adjacent to the channel region, opposite to the first region with regard to the channel region;

a conductor overlying and forming permanent connection between the first region and second region, the conductor extending in spaced overlying relation to the substrate and the floating gate;

the first and second diffused regions being doped with the same dopant of a type opposite that of a dopant in the channel region of the substrate.

5. A memory cell as set forth in claim 4 further comprising an insulation layer tunnel window located intermediate oppositely confronting surfaces of the floating gate and the first region.

6. A memory cell as set forth in any of claims 3, and 4, 5, further comprising a lightly doped drain type implantation adjacently contacting the first region to extend the first region slightly beneath the control gate.

* * * * *